(12) United States Patent
Lee et al.

(10) Patent No.: US 10,553,585 B2
(45) Date of Patent: Feb. 4, 2020

(54) SEMICONDUCTOR DEVICE

(71) Applicant: Samsung Electronics Co., Ltd., Suwon-si, Gyeonggi-do (KR)

(72) Inventors: Dae Seong Lee, Busan (KR); Min Su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/059,562

(22) Filed: Aug. 9, 2018

(65) Prior Publication Data
US 2018/0350815 A1 Dec. 6, 2018

Related U.S. Application Data

(62) Division of application No. 15/428,308, filed on Feb. 9, 2017, now Pat. No. 10,062,697.

(Continued)

(30) Foreign Application Priority Data

Apr. 22, 2016 (KR) .................. 10-2016-0049271

(51) Int. Cl.
H01L 27/092 (2006.01)
H03K 19/20 (2006.01)
(Continued)

(52) U.S. Cl.
CPC ........ H01L 27/0924 (2013.01); H01L 23/528 (2013.01); H01L 27/0207 (2013.01);
(Continued)

(58) Field of Classification Search
CPC ..... H01L 21/823828; H01L 21/823871; H01L 23/528; H01L 27/0207; H01L 27/092; H01L 27/0924; H01L 29/785; H03K 19/0948; H03K 19/20; H03K 3/356156; H03K 3/35625
See application file for complete search history.

(56) References Cited

U.S. PATENT DOCUMENTS 4,885,716 A * 12/1989 Little .................. G06F 7/503
708/707
5,978,262 A * 11/1999 Marquot ............. G11C 16/12
365/185.01

(Continued)

Primary Examiner — Mohammed Shamsuzzaman
(74) Attorney, Agent, or Firm — Harness, Dickey & Pierce, P.L.C.

(57) ABSTRACT

A semiconductor device includes a first active region, a second active region, a first gate line disposed to overlap the first and second active regions, a second gate line disposed to overlap the first and second active regions, a first metal line electrically connecting the first and second gate lines and providing a first signal to both the first and second gate lines, a first contact structure electrically connected to part of the first active region between the first and second gate lines, a second contact structure electrically connected to part of the second active region between the first and second gate lines, and a second metal line electrically connected to the first and second contact structures and transmitting a second signal, wherein an overlapped region that is overlapped by the second metal line does not include a break region.

15 Claims, 25 Drawing Sheets

Related U.S. Application Data

(60) Provisional application No. 62/295,569, filed on Feb. 16, 2016.

(51) Int. Cl.

| | |
|---|---|
| *H01L 23/528* | (2006.01) |
| *H03K 19/0948* | (2006.01) |
| *H03K 3/356* | (2006.01) |
| *H03K 3/3562* | (2006.01) |
| *H01L 27/02* | (2006.01) |
| *H01L 29/78* | (2006.01) |
| *H01L 21/8238* | (2006.01) |

(52) U.S. Cl.
CPC .......... *H01L 27/092* (2013.01); *H01L 29/785* (2013.01); *H03K 3/35625* (2013.01); *H03K 3/356156* (2013.01); *H03K 19/0948* (2013.01); *H03K 19/20* (2013.01); *H01L 21/823828* (2013.01); *H01L 21/823871* (2013.01)

(56) References Cited

U.S. PATENT DOCUMENTS

| | | | |
|---|---|---|---|
| 7,383,459 B1* | 6/2008 | Jones | G06F 5/065 |
| | | | 713/400 |
| 7,681,164 B2 | 3/2010 | Lin et al. | |
| 8,159,268 B1* | 4/2012 | Madurawe | H01L 27/11807 |
| | | | 326/101 |
| 8,766,364 B2 | 7/2014 | Doornbos et al. | |
| 9,123,565 B2* | 9/2015 | Lu | H01L 27/092 |
| 2001/0028059 A1* | 10/2001 | Emma | H01L 27/1108 |
| | | | 257/67 |
| 2004/0214389 A1* | 10/2004 | Madurawe | G11C 11/412 |
| | | | 438/202 |
| 2005/0285623 A1* | 12/2005 | Jahan | H03K 3/356113 |
| | | | 326/68 |
| 2007/0146034 A1* | 6/2007 | Acharya | H03K 3/356 |
| | | | 327/218 |
| 2017/0117419 A1* | 4/2017 | Berger | H01L 29/365 |

* cited by examiner

Prior Art

SEMICONDUCTOR DEVICE

This is a divisional application of U.S. non-provisional application Ser. No. 15/428,308, filed on Feb. 9, 2017, which claims the benefit of priority from US Provisional Application No. 62/295,569 filed on Feb. 16, 2016 in the USPTO and from Korean Patent Application No. 10-2016-0049271 filed on Apr. 22, 2016 in the Korean Intellectual Property Office (KIPO), the disclosures of each of which are incorporated herein by reference in their entirety.

BACKGROUND

1. Technical Field

The present disclosure relates to a semiconductor device and processes for fabricating semiconductor devices.

2. Description of the Related Art

During the fabrication of a semiconductor device, problems may often arise where a break region formed between transistors as part of the introduction of Fin Field Effect Transistor (FinFET) process refinement applies stress to the transistors formed on the semiconductor device. Particularly, the stress applied to the transistors may result in failed transistors that will lower process yield.

To reduce the area of the semiconductor device, the width of the break region may be reduced, which, however, leads to unexpected defects. To address this problem, the width of the break region may be increased, which, consequently, leads to an increase in the area of the entire semiconductor device.

SUMMARY

Various example embodiments of the present disclosure provide a semiconductor device capable of having a smaller area while preventing stress from being applied to the transistors included in the semiconductor device.

Some example embodiments of the present disclosure also provide a semiconductor device in which a break region is not formed, and a gate electrode is formed instead in an area corresponding to the break region.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a semiconductor device including a first active region, a second active region spaced apart from the first active region, a first gate line disposed to overlap the first and the second active regions, a second gate line disposed to overlap the first and the second active regions, and spaced apart from the first gate line, a first metal line electrically connecting the first and the second gate lines and configured to provide a first signal to both the first and the second gate lines, a first contact structure electrically connected to at least a part of the first active region between the first and the second gate lines, a second contact structure electrically connected to at least a part of the second active region between the first and the second gate lines, and a second metal line electrically connected to the first and the second contact structures and configured to transmit a second signal, the second signal output in response to the first signal, wherein a region that is overlapped by the second metal line does not include a break region that physically separates the first or the second active region.

According to some example embodiments of the present disclosure, there is provided a semiconductor device including a first active region, a second active region spaced apart from the first active region, a first gate line, a second gate line, and a third gate line, the first gate line, the second gate line, and the third gate lines disposed to overlap the first and the second active regions and spaced apart from each other, a first metal line configured to provide a first signal to both the first and the second gate lines as an input, and a second metal line configured to transmit a second signal in response to the first signal, and provide the second signal to the third gate line as an input, wherein parts of the first and the second active regions between the first and third gate lines are formed without a break.

According to some example embodiments of the present disclosure, there is provided a semiconductor device including a first NMOS transistor configured to share a first drain node with a first PMOS transistor, a second NMOS transistor share a second drain node with a second PMOS transistor, a first node connected to, and configured to provide a first signal to, a gate node of the first PMOS transistor, a gate node of the first NMOS transistor, a gate node of the second PMOS transistor, and a gate node of the second NMOS transistor, a second node connected to both the first and second drain nodes and configured to output a second signal, a third PMOS transistor configured to receive the second signal output from the second node as an input signal, and a third NMOS transistor configured to receive the second signal output from the second node as an input signal.

According to some example embodiments of the present disclosure, there is provided a semiconductor device including a first active fin extending in a first direction, a second active fin spaced apart from the first active fin and extending in the first direction, a first gate line extending in a second direction, the second direction intersecting the first direction, the first gate line overlapping the first and second active fins, a second gate line extending in the second direction and spaced apart from the first gate line, the second gate line overlapping the first and second active fins, a first metal line electrically connecting the first and second gate lines and configured to provide a first signal to both the first gate line and the second gate line, and a second metal line electrically connected to a part of the first active fin between the first gate line and the second gate line and a part of the second active fin between the first gate line and the second gate line, and configured to transmit a second signal in response to the first signal, wherein a region that is overlapped by the second metal line does not include a break region that physically separates the first active fin or the second active fin.

According to some example embodiments of the present disclosure, there is provided a semiconductor device including a first active region and a second active region, the first active region and the second active region arranged to not contact each other and each not including a break region, the break region physically separating a first section of the active region and a second section of the active region, a first gate line disposed to cover at least an entire width of the first active region and the second active region, a second gate line disposed to cover at least an entire width of the first active region and the second active region, a first metal line configured to provide a first signal to both the first gate line and the second gate line, and a second metal line configured to transmit a second signal based on the first signal.

Other features and aspects will be apparent from the following detailed description, the drawings, and the claims.

DETAILED DESCRIPTION

Semiconductor devices or circuits according to at least one example embodiment of the present disclosure may be applicable to flip-flop circuits, which are important elements in the design of a System-On-Chip (SOC), Application Specific Integrated Circuit (ASIC), etc. Additionally, at least one example embodiment may be applicable to back-to-back latch circuits, which are basic latch circuits, as well, but the present disclosure is not limited thereto. That is, the semiconductor devices or circuits according to some example embodiments of the present disclosure may also be applicable to other circuits, other than flip-flop circuits and back-to-back latch circuits, without departing from the scope of the present disclosure.

Figure 1:
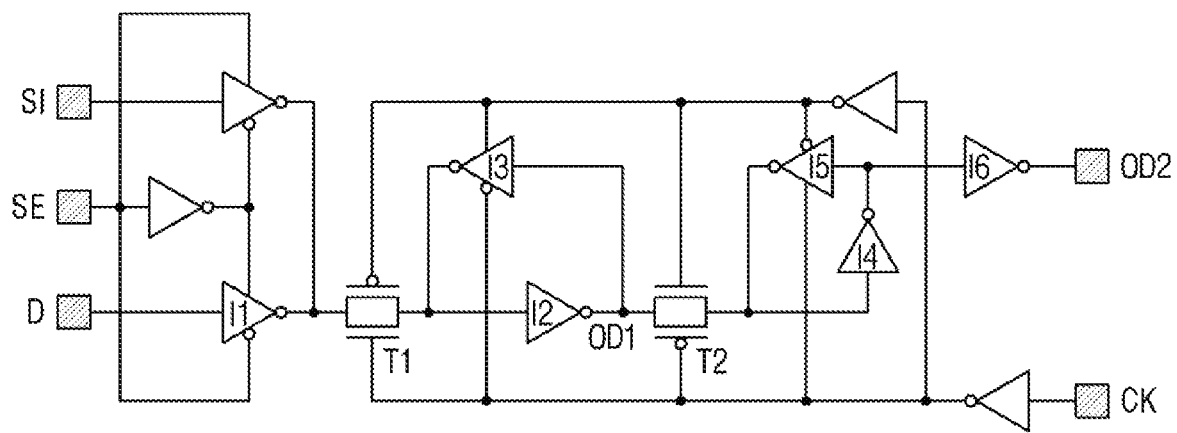
FIG. 1 is a circuit diagram of a flip-flop circuit including a mux scan according to at least one example embodiment.

FIG. 1 is a circuit diagram of a flip-flop circuit including a mux scan according to at least one example embodiment.

Referring to FIG. 1, the flip-flop circuit may include, for example, a first inverter I1, a first transfer gate T1, a second inverter I2, a third inverter I3, a second transfer gate T2, a fourth inverter I4, a fifth inverter I5, and a sixth inverter I6 according to at least one example embodiment, but the example embodiments are not limited thereto.

The first transfer gate T1 may be controlled by clocks that are provided to both ends of the first transfer gate T1, and may determine whether to transmit input data D, which is inverted by the first inverter I1 and input to the first transfer gate T1.

The second and third inverters I2 and I3 may latch the input data D provided by the first transfer gate T1. The latched input data from first transfer gate T1 may be output as output data OD1 of the second inverter I2.

The second transfer gate T2 may be controlled by clocks (not shown) that are provided to both ends of the second transfer gate T2, and may determine whether to transmit the output data OD1 of the second inverter I2. First output data OD1 is provided to the second transfer gate T2 without being inverted.

The fourth and fifth inverters I4 and I5 may latch the first output data OD1 provided by the second transfer gate T2. The output data latched by inverters I4 and I5 may be inverted by the sixth inverter I6 and may then be output as second output data OD2.

Each of the second and fourth inverters I2 and I4 may be implemented as a single "finger." The term "finger" is a term of art indicating a gate line. In the following description, a finger denotes a gate line.

Since the second and fourth inverters I2 and I4 are implemented as fingers, a break region is formed in the physical layout of the semiconductor device. In other words, the semiconductor device including the second and fourth inverters I2 and I4 includes a break region on the semiconductor wafer that the semiconductor is being fabricated on. The term "break region" denotes a region that is disconnected from an active region to prevent the diffusion of impurities into the active region, and means that the active region is broken (e.g., not physically continuous).

The second and fourth inverters I2 and I4 include the break region, and fabrication and/or doping defects may occur near the break region, thereby causing stress to the transistors. Accordingly, the performance of the transistors may deteriorate, and the production yield of the semiconductor devices may decrease.

According to some example embodiments of the present disclosure, the break region may be eliminated, and a gate line including a gate electrode may be formed to replace the break region.

Figure 2:
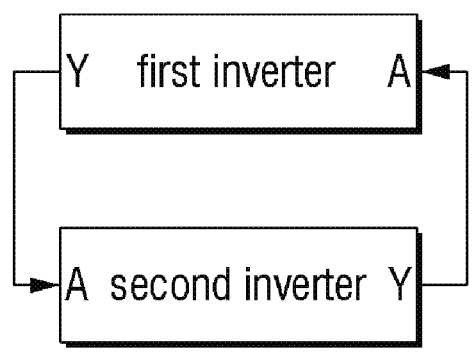
FIG. 2 is a block diagram illustrating the concept of a latch circuit according to at least one example embodiment of the present disclosure.

FIG. 2 is a block diagram illustrating the concept of a latch circuit according to at least one example embodiment of the present disclosure.

Referring to FIG. 2, the inventive concepts of the present disclosure may be applicable to a back-to-back latch circuit, but is not limited thereto. The back-to-back latch circuit is a circuit in which output Y of a first inverter is provided as input A for a second inverter. Additionally, the output Y of the second inverter is provided as input A for the first inverter.

That is, the inventive concepts of the present disclosure may be applicable to a structure comprising two or more inverters. The inventive concepts of the present disclosure may also be applicable to various circuits other than the back-to-back latch circuit.

Figure 3:
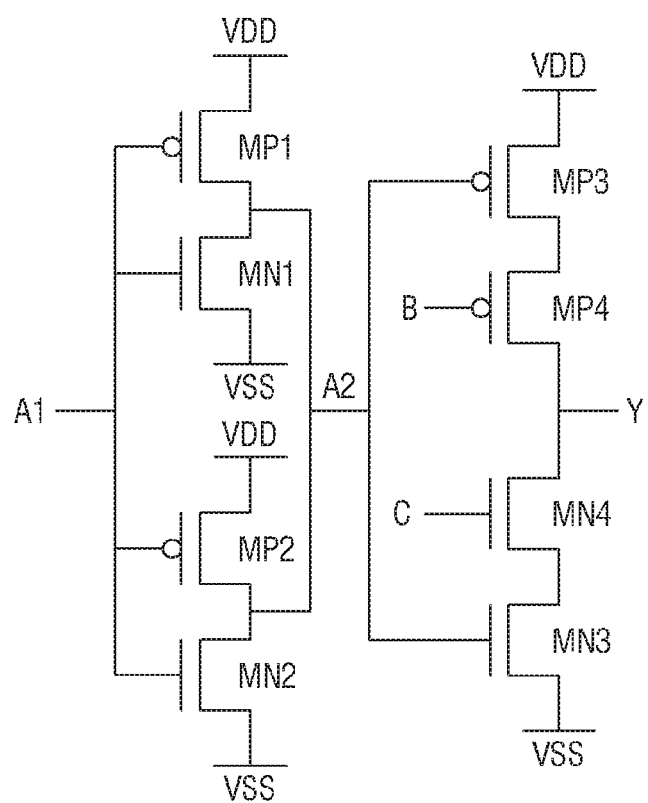
FIG. 3 is a circuit diagram of a semiconductor device to which the latch circuit of FIG. 2 is applied according to at least one example embodiment.

FIG. 3 is a circuit diagram of a semiconductor device to which the latch circuit of FIG. 2 is applied according to at least one example embodiment.

Referring to FIG. 3, the second inverter may include a first P-type Metal-Oxide-Semiconductor (PMOS) transistor MP1, a first N-type Metal-Oxide-Semiconductor (NMOS) transistor MN1, a second PMOS transistor MP2, and a second NMOS transistor MN2, according to at least one example embodiment, but is not limited thereto. The first inverter may include a third PMOS transistor MP3, a fourth PMOS transistor MP4, a third NMOS transistor MN3, and a fourth NMOS transistor MN4 according to at least one example embodiment, but is not limited thereto.

The semiconductor device of FIG. 3 is an example circuitry to which one or more example embodiments of the inventive concepts is applicable, and changes and modifications may be made thereto without departing from the scope of the present disclosure.

More specifically, referring to the second inverter of FIG. 3, the first PMOS transistor MP1 may share a drain node with the first NMOS transistor MN1, and the second PMOS transistor MP2 may share a drain node with the second NMOS transistor MN2.

A first signal A1 may be input (e.g., provided) to the gate node of the first PMOS transistor MP1, the gate node of the first NMOS transistor MN1, the gate node of the second PMOS transistor MP2, and the gate node of the second NMOS transistor MN2. In response to receiving the first signal A1 as an input, a second signal A2 may be output from the drain node that the first PMOS and NMOS transistors MP1 and MN1 share, and the drain node that the second PMOS and NMOS transistors MP2 and MN2 share.

The source node of the first PMOS transistor MP1 may be connected to a driving power supply VDD, and the source node of the first NMOS transistor MN1 may be connected to ground VSS.

Similarly, the source node of the second PMOS transistor MP2 may be connected to the driving power supply VDD, and the source node of the second NMOS transistor MN2 may be connected to the ground VSS.

Referring now to the first inverter of FIG. 3, the third PMOS transistor MP3 may share a drain node with the fourth PMOS transistor MP4, and the third NMOS transistor MN3 may share a drain node with the fourth NMOS transistor MN4 according to at least one example embodiment, but is not limited thereto.

The second signal A2, output from the second inverter, may be input to the gate node of the third PMOS transistor MP3 and the gate node of the third NMOS transistor MN3. A third signal B may be input to the gate node of the fourth PMOS transistor MP4, and a fourth signal C may be input to the gate node of the fourth NMOS transistor MN4.

The source node of the fourth PMOS transistor MP4 and the source node of the fourth NMOS transistor MN4 may be connected to the same output node, and a fifth signal Y may be output from the output node that the fourth PMOS and NMOS transistors MP4 and MN4 are both connected to.

The source node of the third PMOS transistor MP3 may be connected to the driving power supply VDD, and the source node of the third NMOS transistor MN3 may be connected to the ground VSS.

The first PMOS transistor MP1, the first NMOS transistor MN1, the second PMOS transistor MP2, and the second NMOS transistor MN2 may form a first latch circuit, and the third PMOS transistor MP3, the fourth PMOS transistor MP4, the third NMOS transistor MN3, and the fourth NMOS transistor MN4 may form a second latch circuit.

The first latch circuit may be a master latch circuit, and the second latch circuit may operate as a slave latch circuit according to at least one example embodiment.

In the circuitry illustrated in FIG. 3, the first PMOS transistor MP1, the first NMOS transistor MN1, the second PMOS transistor MP2, and the second NMOS transistor MN2 may be implemented as two fingers and may all receive the first signal A1 according to at least one example embodiment. The circuitry illustrated in FIG. 3 will be described in further detail with reference to FIG. 4.

Figure 4:
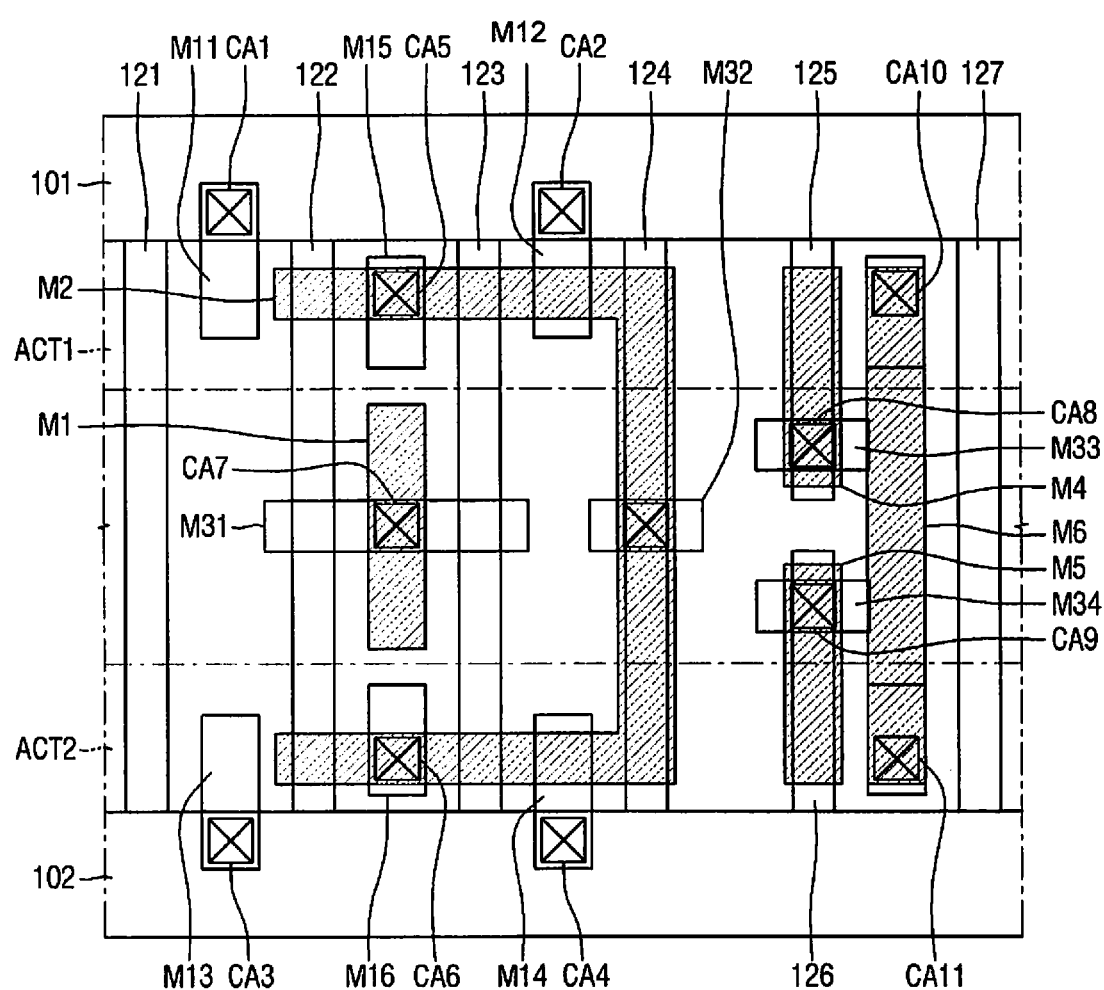
FIG. 4 is a layout view illustrating an example implementation of the circuit diagram of FIG. 3 according to at least one example embodiment.

FIG. 4 is a layout view illustrating an example implementation of the circuit diagram of FIG. 3 according to at least one example embodiment.

Referring to FIG. 4, the semiconductor device according to the example embodiment of FIG. 3 includes a first power rail 101, a second power rail 102, a first active region ACT1, a second active region ACT2, first through seventh gate lines 121 through 127, first through sixth metal structures M11 through M16, third metal lines M31 through M34, a fourth metal line M4, a fifth metal line M5, and a sixth metal line M6 according to at least one example embodiment, but the example embodiments are not limited thereto.

The first power rail 101 may be connected to a driving power supply VDD and may provide driving power VDD to the first through fourth gate lines 121 through 124 via the first and second contact structures CA1 and CA2.

The second power rail 102 may be connected to ground VSS and may provide ground drain VSS to the first through fourth gate lines 121 through 124 via the third and fourth contact structures CA3 and CA4.

The first and second active regions ACT1 and ACT2 may be spaced apart from each other. The first gate line 121 may be disposed to overlap the first and second active regions ACT1 and ACT2, the second gate line 122 may also be disposed to overlap the first and second active regions ACT1 and ACT2, the third gate line 123 may also be disposed to overlap the first and second active regions ACT1 and ACT2, and the fourth gate line 124 may also be disposed to overlap the first and second active regions ACT1 and ACT2. For example, the gate lines may be disposed such that each of the gate lines cover the entire width of the first active region and the second active region.

The fifth gate line 125 may be disposed to overlap the first active region ACT1, the sixth gate line 126 may be disposed to overlap the second active region ACT2, and the seventh gate line 127 may be disposed to overlap the first and second active regions ACT1 and ACT2.

The first through seventh gate lines 121 through 127 may be spaced apart from one another and/or from other neighboring gate lines, if any.

The second gate line 122 may include the first PMOS and NMOS transistors MP1 and MN1 of FIG. 3, in other words the first PMOS and NMOS transistors MP1 and MN1 may be formed using the second gate line 122. For example, part of the second gate line 122 that overlaps (e.g., contacts) the first active region ACT1 may be formed as the first PMOS transistor MP1, and part of the second gate line 122 that overlaps (e.g., contacts) the second active region ACT2 may be formed as the first NMOS transistor MN1.

The third gate line 123 may include the second PMOS and NMOS transistors MP2 and MN2 of FIG. 3, in other words the second PMOS and NMOS transistors MP2 and MN2 may be formed using the third gate line 123. For example, part of the third gate line 123 that overlaps (e.g., contacts) the first active region ACT1 may be formed as the second PMOS transistor MP2, and part of the third gate line 123 that overlaps (e.g., contacts) the second active region ACT2 may be formed as the second NMOS transistor MN2.

The gate electrodes of the second and third gate lines 122 and 123 may be electrically connected to each other by the third metal line M31. The seventh contact structure CA7 may be formed on the third metal line M31 and may be electrically connected to the first metal line M1. Accordingly, the first signal A1 of FIG. 3 may be transmitted along the first metal line M1 and may be provided to the gate electrodes of the second and third gate lines 122 and 123 via the seventh contact structure CA7 as an input signal.

That is, the first PMOS transistor MP1, the first NMOS transistor MN1, the second PMOS transistor MP2, and the second NMOS transistor MN2 may all receive the first signal A1 as an input signal.

At least part of the first active region ACT1 between the second and third gate lines 122 and 123 may be a first drain region. That is, the first PMOS transistor MP1 included in the second gate line 122 and the second PMOS transistor MP2 included in the third gate line 123 may share the first drain region.

The fifth metal structure M15 may be formed on the first drain region, and the fifth contact structure CA5 may be formed on the fifth metal structure M15. The fifth contact structure CA5 may be electrically connected to the fifth metal structure M15.

At least part of the second active region ACT2 between the second and third gate lines 122 and 123 may be a second drain region. That is, the first NMOS transistor MN1 included in the second gate line 122 and the second NMOS transistor MN2 included in the third gate line 123 may share the second drain region.

The sixth metal structure M16 may be formed on the second drain region, and the sixth contact structure CA6 may be formed on the sixth metal structure M16. The sixth contact structure CA6 may be electrically connected to the sixth metal structure M16.

The fifth and sixth contact structures CA5 and CA6 may also be electrically connected to the second metal line M2. The second signal A2 of FIG. 3, which is output in response to the first signal A1 being input, may be transmitted to the second metal line M2.

The second metal line M2 may be electrically connected to the gate electrode of the fourth gate line 124 via the third metal line M32, and the second signal A2, which is transmitted along the second metal line M2, may be provided to the transistors included in the fourth gate line 124 as an input signal.

More specifically, part of the fourth gate line 124 that overlaps (e.g., contacts) the first active region ACT1 may be the third PMOS transistor MP3 of FIG. 3, and part of the fourth gate line 124 that overlaps (e.g., contacts) the second active region ACT2 may be the third NMOS transistor MN3 of FIG. 3. That is, the third PMOS and NMOS transistors MP3 and MN3 may both receive the second signal A2 as an input signal according to at least one example embodiment.

According to at least one example embodiment of the present disclosure, a region that is overlapped by the second metal line M2 does not include a break region that physically breaks the first or second active region ACT1 or ACT2. That is, by replacing a break region with a gate line including a gate electrode, a semiconductor device having no break region may be realized. Accordingly, the cause of stress applied to the transistors included in each gate line may be eliminated, or the stress may be reduced, thereby increasing the production yield of the semiconductor devices.

Also, by eliminating an unnecessary break region, the area of an entire semiconductor device may be prevented from increasing, or in other words, the area of the semiconductor device may be reduced, and this will be described in detail with reference to FIG. 5.

Figure 5:
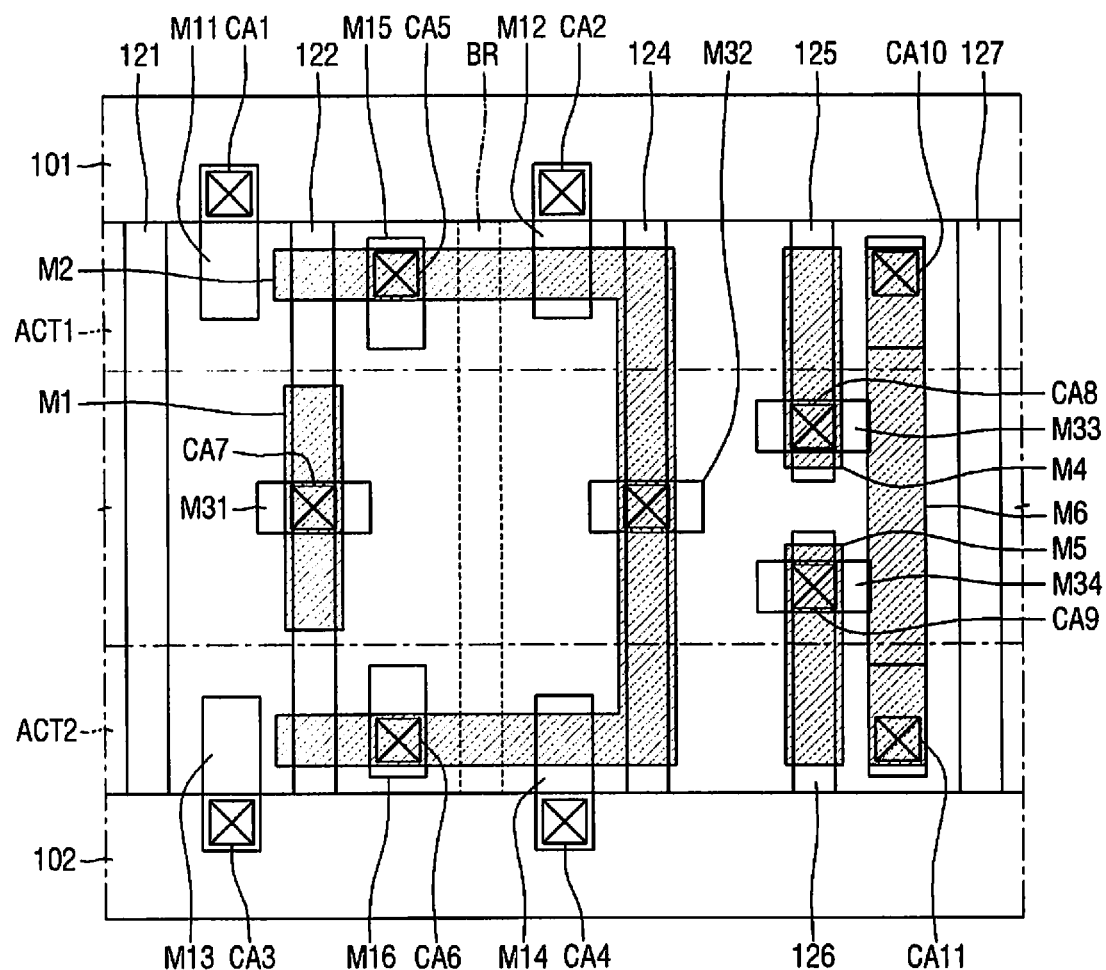
FIG. 5 is a layout view of a related-art semiconductor device including a break region.

FIG. 5 is a layout view of a related-art semiconductor device that includes a break region.

Referring to FIG. 5, the structure of the semiconductor device is substantially the same as the semiconductor device illustrated in FIG. 4, with similar structural components depicted using the same reference numerals as in FIG. 4. Description of those like components will be omitted here, and instead discussion will be focused on the components that differ in FIG. 5 from FIG. 4.

In FIG. 5, a break region BR is formed between second and fourth gate lines 122 and 124. That is, the break region BR, is a region which cuts (e.g., interrupts, physically separates, etc.) each of the first and second active regions ACT1 and ACT2 may be formed. For example, a break region BR may be formed that cuts each of the first active region ACT1 and the active region ACT2 approximately in half (e.g., the BR region is formed so that it bisects ACT1 and ACT2 in approximately the middle of both ACT1 and ACT2), but is not limited thereto and may cut the active regions in any other area. The break region BR is formed to prevent the diffusion of impurities during impurity doping, and may be provided as, for example, a Single Diffusion Break (SDB) or a Double Diffusion Break (DDB), etc.

The formation of the break region BR may apply stress to the transistors located proximate to the break region BR, for example the transistors included in the second gate line 122 or the transistors included in the fourth gate line 124, etc. Thus, the formation of the break region BR may cause the performance of the transistors to deteriorate and/or have other negative effects on the transistors located proximate to the break region BR. According to at least one example embodiment of the present disclosure, the break region BR is replaced with a gate line including a gate electrode and addresses the problems associated with the forming and/or use of a break region BR in a semiconductor device.

Referring again to FIG. 4, the first metal structure M11 may be formed on the source region of the first PMOS transistor MP1, which is included in the second gate line 122, the first contact structure CA1 may be formed on the first metal structure M11, and the first contact structure CA1 may be electrically connected to the first power rail 101. Accordingly, the source region of the first PMOS transistor MP1 may receive the driving power VDD from the first power rail 101 as discussed in connection with FIG. 3.

The second metal structure M12 may be formed on the source region of the second PMOS transistor MP2, which is included in the third gate line 123, the second contact structure CA2 may be formed on the second metal structure M12, and the second contact structure CA2 may be electrically connected to the first power rail 101. Accordingly, the source region of the second PMOS transistor MP2 may receive the driving power VDD from the first power rail 101 as discussed in connection with FIG. 3.

The third metal structure M13 may be formed on the source region of the first NMOS transistor MN1, which is included in the second gate line 122, the third contact structure CA3 may be formed on the third metal structure M13, and the third contact structure CA3 may be electrically connected to the second power rail 102. Accordingly, the source region of the first NMOS transistor MN1 may receive the ground drain VSS from the second power rail 102 as discussed in connection with FIG. 3.

The fourth metal structure M14 may be formed on the source region of the second NMOS transistor MN2, which is included in the third gate line 123, the fourth contact structure CA4 may be formed on the fourth metal structure M14, and the fourth contact structure CA2 may be electrically connected to the second power rail 102. Accordingly, the source region of the second NMOS transistor MN2 may receive the ground power VSS from the second power rail 102 as discussed in connection with FIG. 3.

The fourth PMOS transistor MP4 of FIG. 3 may be formed in a part of the fifth gate line 125 that overlaps (e.g., contacts) the first active region ACT1. The third metal line M33 may be formed on the fifth gate line 125, the eighth contact structure CA8 may be formed on the third metal line M33, and the fourth metal line M4 may be formed on the eighth contact structure CA8. The fifth gate line 125 and the fourth metal line M4 may be electrically connected by the third metal line M33 and the eighth contact structure CA8, and the third signal B of FIG. 3 may be transmitted via the fourth metal line M4. The third signal B may be provided to the gate electrode of the fourth PMOS transistor MP4 as discussed in connection with FIG. 3, which is formed in the fifth gate line 125.

The fourth NMOS transistor MN4 of FIG. 3 may be formed in a part of the sixth gate line 126 that overlaps (e.g., contacts) the second active region ACT2. The third metal line M34 may be formed on the sixth gate line 126, the ninth contact structure CA9 may be formed on the third metal line M34, and the fifth metal line M5 may be formed on the ninth contact structure CA9. The sixth gate line 126 and the fifth metal line M5 may be electrically connected by the third metal line M34 and the ninth contact structure CA9, and the fourth signal C of FIG. 3 may be transmitted via the fifth metal line M5. The fourth signal C may be provided to the gate electrode of the fourth NMOS transistor MN4 as discussed in connection with FIG. 3, which is formed in the sixth gate line 126.

The source region of the fourth PMOS transistor MP4, which is included in the fifth gate line 125, may be formed in the first active region ACT1, and the tenth contact structure CA10 may be formed on the source region of the fourth PMOS transistor MP4. The tenth contact structure CA10 may be electrically connected to the sixth metal line M6.

The source region of the fourth NMOS transistor MN4, which is included in the sixth gate line 126, may be formed in the second active region ACT2, and the eleventh contact structure CA11 may be formed on the source region of the fourth NMOS transistor MN4. The eleventh contact structure CA11 may be electrically connected to the sixth metal line M6.

The fifth signal Y of FIG. 3 may be transmitted to the sixth metal line M6, to which the tenth and eleventh contact structures CA10 and CA11 are electrically connected, as an output signal.

The first inverter illustrated in FIGS. 2 and 3 includes the third PMOS transistor MP3, the fourth PMOS transistor MP4, the third NMOS transistor MN3, and the fourth NMOS transistor MN4, and other example first inverters will hereinafter be described with reference to FIGS. 6 through 21.

FIGS. 6 through 21 are circuit diagrams of examples of the first inverter of FIG. 2 according to some example embodiments.

Figure 6:
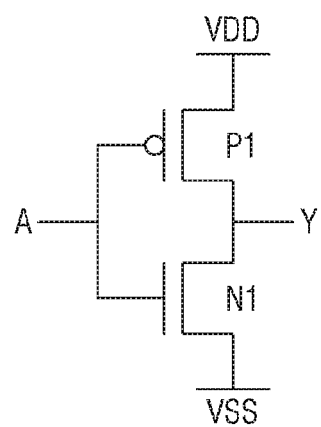
FIGS. 6 through 21 are circuit diagrams of examples of a first inverter of FIG. 2 according to some example embodiments.

Referring to FIG. 6, a first inverter may include a PMOS transistor P1 and an NMOS transistor N1. The source node of the PMOS transistor P1 may be connected to a driving power supply VDD, and the source node of the NMOS transistor N1 may be connected to ground VSS according to at least one example embodiment.

The PMOS transistor P1 and the NMOS transistor N1 may share a drain node, and the gate node of the PMOS transistor P1 and the gate node of the NMOS transistor N1 may be provided with (e.g., receive) the same input signal, such as an input signal A according to at least one example embodiment.

An output signal Y may be output from the drain node that the PMOS transistor P1 and the NMOS transistor N1 share according to at least one example embodiment.

Figure 7:
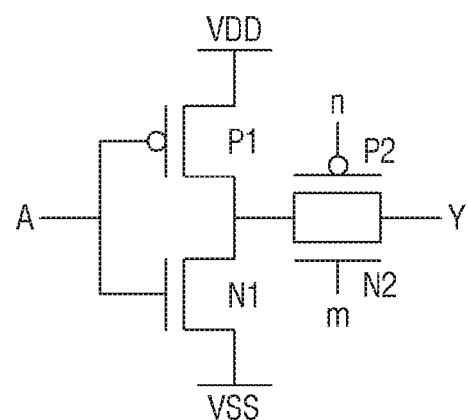

Referring to FIG. 7, a first inverter may include a PMOS transistor P1, an NMOS transistor N1, and a transfer gate, which includes a PMOS transistor P2 and an NMOS transistor N2 according to at least one example embodiment. The source node of the PMOS transistor P1 may be connected to a driving power supply VDD, and the source node of the NMOS transistor N1 may be connected to ground VSS according to at least one example embodiment.

The PMOS transistor P1 and the NMOS transistor N1 may share a drain node, and the gate node of the PMOS transistor P1 and the gate node of the NMOS transistor N1 may be provided with (e.g., receive) the same input signal, such as an input signal A.

An output signal Y output from the drain node that the PMOS transistor P1 and the NMOS transistor N1 share may be transmitted via the transfer gate including the PMOS transistor P2 and the NMOS transistor N2. The gate node of the PMOS transistor P2 may be provided with (e.g., receive) an input signal n. Additionally, the gate node of the NMOS transistor N2 may be provided with (e.g., receive) an input signal m.

Figure 8:
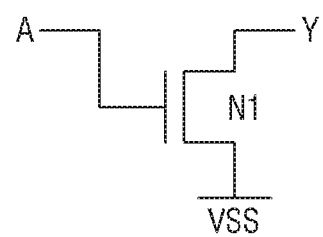

Referring to FIG. 8, a first inverter may include an NMOS transistor N1 according to at least one example embodiment.

The source node of the NMOS transistor N1 may be connected to ground VSS, and the drain node of the NMOS transistor N1 may be connected to an output node.

The gate node of the NMOS transistor N1 may be provided with (e.g., receive) the same input signal, such as an input signal A, and an output signal Y may be output from the drain node of the NMOS transistor N1.

Figure 9:
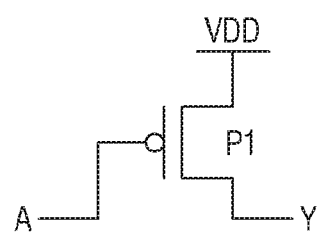

Referring to FIG. 9, a first inverter may include a PMOS transistor P1 according to at least one example embodiment.

The source node of the PMOS transistor P1 may be connected to a driving power supply VDD, and the drain node of the PMOS transistor P1 may be connected to an output node.

The gate node of the PMOS transistor P1 may be provided with (e.g., receive) the same input signal, such as an input signal A, and an output signal Y may be output from the drain node of the PMOS transistor P1.

Figure 10:
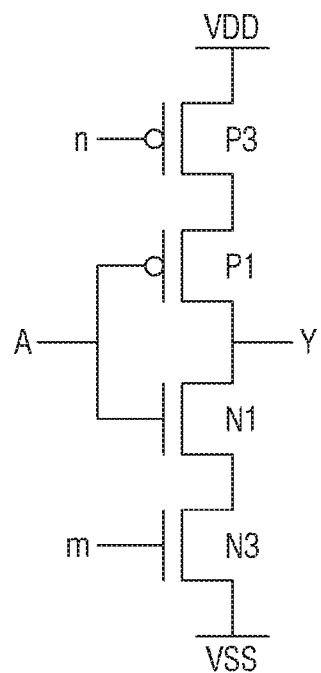

Referring to FIG. 10, a first inverter may include two PMOS transistors P1 and P3 and two NMOS transistors N1 and N3 according to at least one example embodiment.

The source node of the PMOS transistor P3 may be connected to a driving power supply VDD, and the drain node of the PMOS transistor P3 may be connected to the drain node of the PMOS transistor P1.

The source node of the NMOS transistor N3 may be connected to ground VSS, and the drain node of the NMOS transistor N3 may be connected to the drain node of the NMOS transistor N1.

The gate node of the PMOS transistor P1 and the gate node of the NMOS transistor N1 may be connected to the same input node and may be provided with (e.g., receive) the same input signal, such as an input signal A. The source node of the PMOS transistor P1 and the source node of the NMOS transistor N1 may be connected to the same output node and may output an output signal Y. The gate node of the PMOS transistor P3 may be provided with (e.g., receive) an input signal n. Additionally, the gate node of the NMOS transistor N3 may be provided with (e.g., receive) an input signal m.

Figure 11:
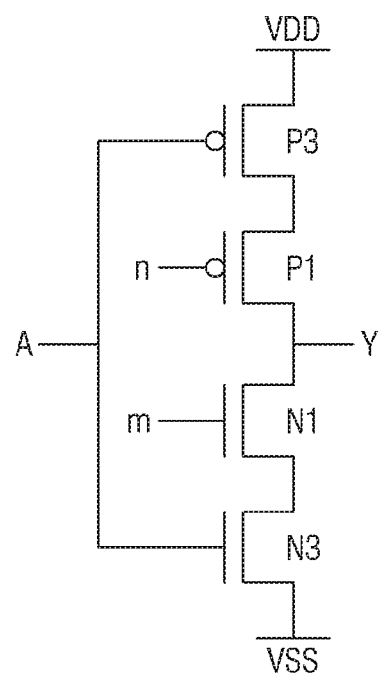

Referring to FIG. 11, a first inverter may include two PMOS transistors P1 and P3 and two NMOS transistors N1 and N3 according to at least one example embodiment.

The source node of the PMOS transistor P3 may be connected to a driving power supply VDD, and the drain node of the PMOS transistor P3 may be connected to the drain node of the PMOS transistor P1.

The source node of the NMOS transistor N3 may be connected to ground VSS, and the drain node of the NMOS transistor N3 may be connected to the drain node of the NMOS transistor N1.

The gate node of the PMOS transistor P3 and the gate node of the NMOS transistor N3 may be connected to the same input node and may be provided with (e.g., receive) the same input signal, such as an input signal A. The source node of the PMOS transistor P1 and the source node of the NMOS transistor N1 may be connected to the same output node and may output an output signal Y. The gate node of the PMOS transistor P1 may be provided with (e.g., receive) an input signal n. Additionally, the gate node of the NMOS transistor N1 may be provided with (e.g., receive) an input signal m.

Figure 12:
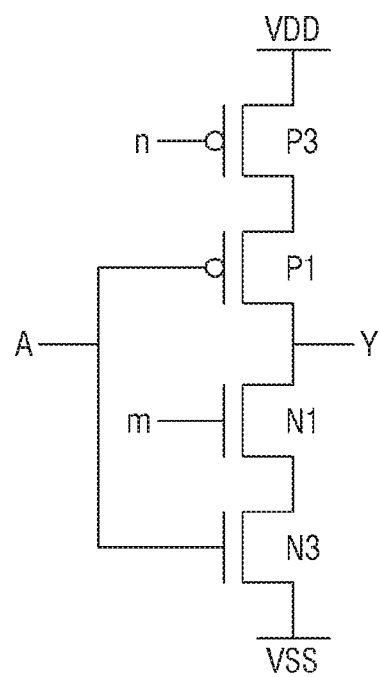

Referring to FIG. 12, a first inverter may include two PMOS transistors P1 and P3 and two NMOS transistors N1 and N3 according to at least one example embodiment.

The source node of the PMOS transistor P3 may be connected to a driving power supply VDD, and the drain node of the PMOS transistor P3 may be connected to the drain node of the PMOS transistor P1.

The source node of the NMOS transistor N3 may be connected to ground VSS, and the drain node of the NMOS transistor N3 may be connected to the drain node of the NMOS transistor N1.

The gate node of the PMOS transistor P1 and the gate node of the NMOS transistor N3 may be connected to the same input node and may be provided with (e.g., receive) the same input signal, such as an input signal A. The source node of the PMOS transistor P1 and the source node of the NMOS transistor N1 may be connected to the same output node and may output an output signal Y. The gate node of the PMOS transistor P3 may be provided with (e.g., receive) an input signal n. Additionally, the gate node of the NMOS transistor N1 may be provided with (e.g., receive) an input signal m.

Figure 13:
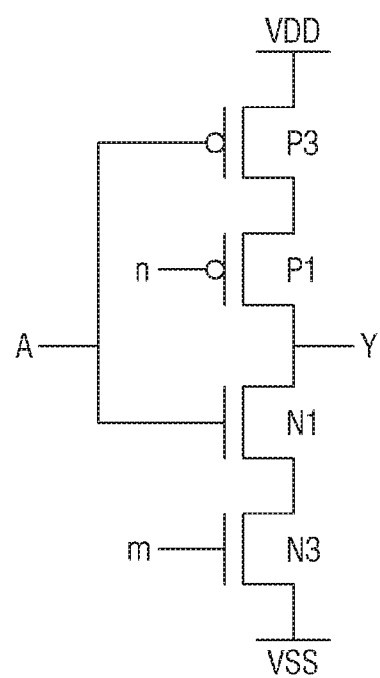

Referring to FIG. 13, a first inverter may include two PMOS transistors P1 and P3 and two NMOS transistors N1 and N3 according to at least one example embodiment.

The source node of the PMOS transistor P3 may be connected to a driving power supply VDD, and the drain node of the PMOS transistor P3 may be connected to the drain node of the PMOS transistor P1.

The source node of the NMOS transistor N3 may be connected to ground VSS, and the drain node of the NMOS transistor N3 may be connected to the drain node of the NMOS transistor N1.

The gate node of the PMOS transistor P3 and the gate node of the NMOS transistor N1 may be connected to the same input node and may be provided with (e.g., receive) the same input signal, such as an input signal A. The source node of the PMOS transistor P1 and the source node of the NMOS transistor N1 may be connected to the same output node and may output an output signal Y. The gate node of the PMOS transistor P1 may be provided with (e.g., receive) an input signal n. Additionally, the gate node of the NMOS transistor N3 may be provided with (e.g., receive) an input signal m.

Figure 14:
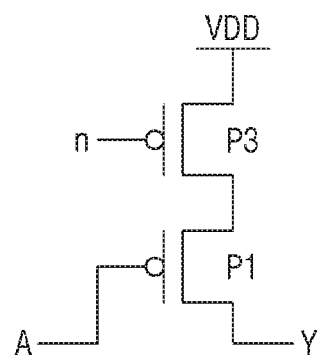

Referring to FIG. 14, a first inverter may include two PMOS transistors P1 and P3 according to at least one example embodiment.

The source node of the PMOS transistor P3 may be connected to a driving power supply VDD, and the drain node of the PMOS transistor P3 may be connected to the drain node of the PMOS transistor P1.

The gate node of the PMOS transistor P1 may be connected to an input node and may be provided with (e.g., receive) an input signal A. The source node of the PMOS transistor P1 may be connected to an output node and may output an output signal Y. The gate node of the PMOS transistor P3 may be provided with (e.g., receive) an input signal n.

Figure 15:
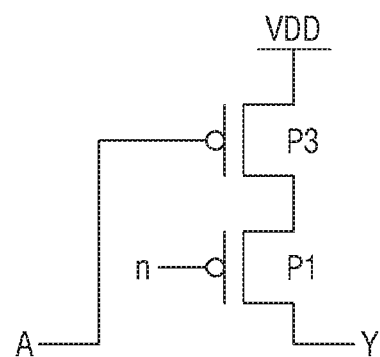

Referring to FIG. 15, a first inverter may include two PMOS transistors P1 and P3 according to at least one example embodiment.

The source node of the PMOS transistor P3 may be connected to a driving power supply VDD, and the drain node of the PMOS transistor P3 may be connected to the drain node of the PMOS transistor P1.

The gate node of the PMOS transistor P3 may be connected to an input node and may be provided with (e.g., receive) an input signal A. The gate node of the PMOS transistor P1 may be provided with (e.g., receive) an input signal n. The source node of the PMOS transistor P1 may be connected to an output node and may output an output signal Y.

Figure 16:
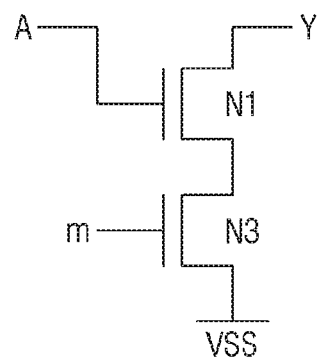

Referring to FIG. 16, a first inverter may include two NMOS transistors N1 and N3 according to at least one example embodiment.

The source node of the NMOS transistor N3 may be connected to ground VSS, and the drain node of the NMOS transistor N3 may be connected to the drain node of the NMOS transistor N1.

The gate node of the NMOS transistor N1 may be connected to an input node and may be provided with (e.g., receive) an input signal A. The gate node of the NMOS transistor N3 may be provided with (e.g., receive) an input signal m. The source node of the NMOS transistor N1 may be connected to an output node and may output an output signal Y.

Figure 17:
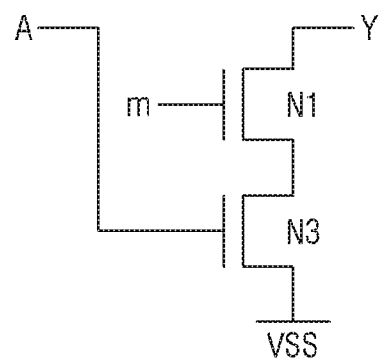

Referring to FIG. 17, a first inverter may include two NMOS transistors N1 and N3 according to at least one example embodiment.

The source node of the NMOS transistor N3 may be connected to ground VSS, and the drain node of the NMOS transistor N3 may be connected to the drain node of the NMOS transistor N1.

The gate node of the NMOS transistor N3 may be connected to an input node and may be provided with (e.g., receive) an input signal A. The gate node of the NMOS transistor N1 may be provided with (e.g., receive) an input signal m. The source node of the NMOS transistor N1 may be connected to an output node and may output an output signal Y.

Figure 18:
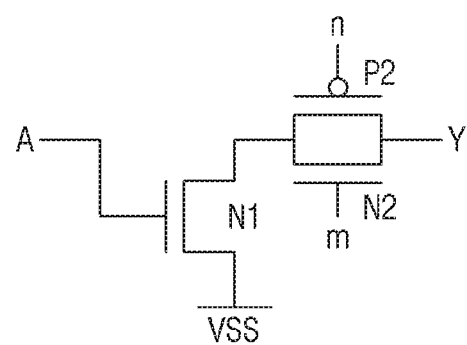

Referring to FIG. 18, a first inverter may include an NMOS transistor N1 and a transfer gate, which includes an NMOS transistor N2 and a PMOS transistor P2 according to at least one example embodiment.

The source node of the NMOS transistor N1 may be connected to ground VSS, and the drain node of the NMOS transistor N1 may be connected to the transfer gate.

The gate node of the NMOS transistor N1 may be connected to an input node and may be provided with (e.g., receive) an input signal A. The gate node of the NMOS transistor N2 may be provided with (e.g., receive) an input signal m. Additionally, the gate node of the PMOS transistor P2 may be provided with (e.g., receive) an input signal n. An output signal Y output from the drain node of the NMOS transistor N1 may be transmitted via the transfer gate.

Figure 19:
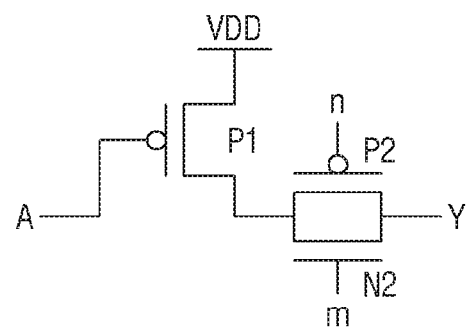

Referring to FIG. 19, a first inverter may include a PMOS transistor P1 and a transfer gate, which includes an NMOS transistor N2 and a PMOS transistor P2 according to at least one example embodiment.

The source node of the PMOS transistor P1 may be connected to a driving power supply VDD, and the drain node of the PMOS transistor P1 may be connected to the transfer gate.

The gate node of the PMOS transistor P1 may be connected to an input node and may be provided with (e.g., receive) an input signal A. The gate node of the NMOS transistor N2 may be provided with (e.g., receive) an input signal m. The gate node of the PMOS transistor P2 may be provided with (e.g., receive) an input signal n. An output signal Y output from the drain node of the PMOS transistor P1 may be transmitted via the transfer gate.

Figure 20:
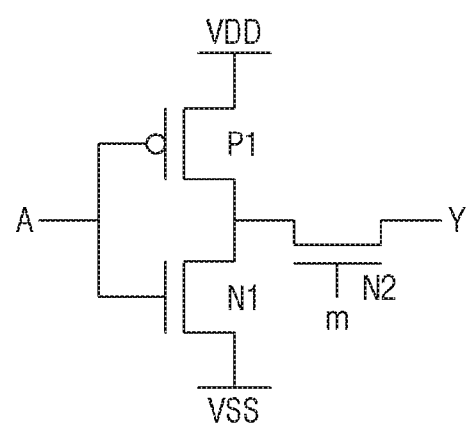

Referring to FIG. 20, a first inverter may include a PMOS transistor P1, an NMOS transistor N1, and a transfer gate, which includes an NMOS transistor N2 according to at least one example embodiment.

The source node of the PMOS transistor P1 may be connected to a driving power supply VDD, the source node of the NMOS transistor N1 may be connected to ground VSS, and the gate node of the PMOS transistor P1 and the gate node of the NMOS transistor N1 may be connected to the same input node and may be provided with (e.g., receive) the same input signal, such as an input signal A. The gate node of the NMOS transistor N2 may be provided with (e.g., receive) an input signal m.

The drain node of the PMOS transistor P1 and the drain node of the NMOS transistor N1 may be connected to the same drain node and may thus be connected to the transfer gate, NMOS transistor N2.

An output signal Y output from the drain node that the PMOS transistor P1 and the NMOS transistor N1 are both connected to may be transmitted via the transfer gate NMOS transistor N2.

Figure 21:
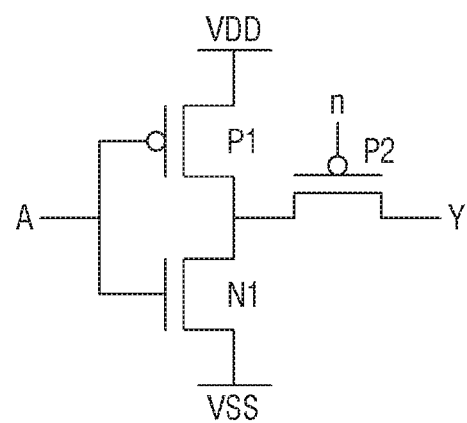

Referring to FIG. 21, a first inverter may include a PMOS transistor P1, an NMOS transistor N1, and a transfer gate, which includes a PMOS transistor P2 according to at least one example embodiment.

The source node of the PMOS transistor P1 may be connected to a driving power supply VDD, the source node of the NMOS transistor N1 may be connected to ground VSS, and the gate node of the PMOS transistor P1 and the gate node of the NMOS transistor N1 may be connected to the same input node and may be provided with (e.g., receive) the same input signal, such as an input signal A. The gate node of the PMOS transistor P2 may be provided with (e.g., receive) an input signal n.

The drain node of the PMOS transistor P1 and the drain node of the NMOS transistor N1 may be connected to the same drain node and may thus be connected to the transfer gate PMOS transistor P2.

An output signal Y output from the drain node that the PMOS transistor P1 and the NMOS transistor N1 are both connected to, and may be transmitted via, the transfer gate PMOS transistor P2.

According to some example embodiments, the second inverter illustrated in FIGS. 2 and 3 includes the first PMOS transistor MP1, the first NMOS transistor MN1, the second PMOS transistor MP2, and the second NMOS transistor MN2. The second inverters of FIGS. 2 and 3 and other example second inverters according to other example embodiments will hereinafter be described with reference to FIGS. 22 and 23.

Figure 22:
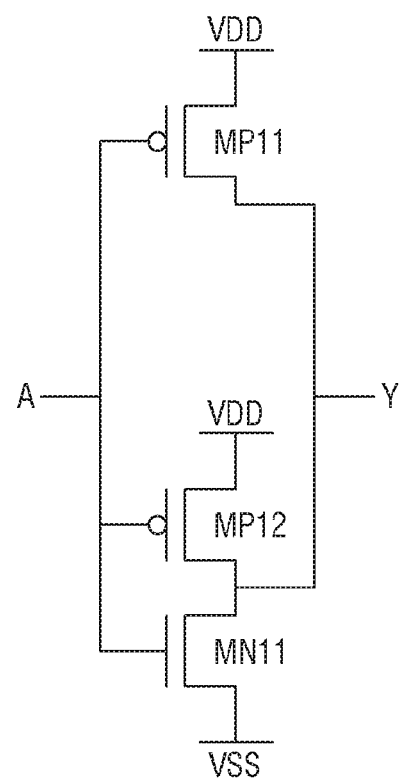
FIGS. 22 and 23 are circuit diagrams of examples of a second inverter of FIG. 2 according to some example embodiments.
Figure 23:
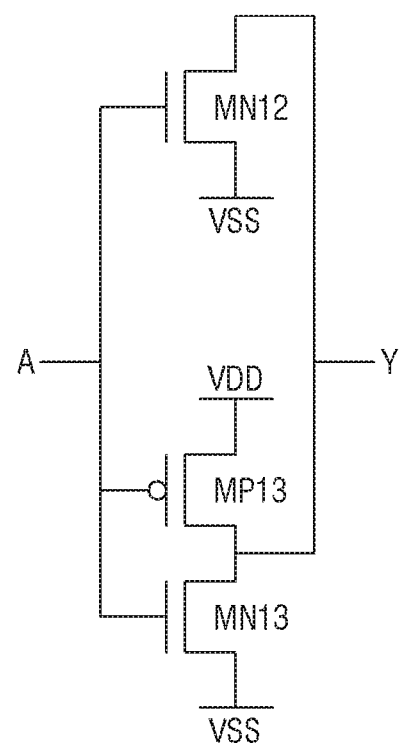

FIGS. 22 and 23 are circuit diagrams of examples of the second inverter of FIG. 2 according to some example embodiments.

Referring to FIG. 22, a second inverter may include a PMOS transistor MPH, an NMOS transistor MN11, and a PMOS transistor MP12 according to at least one example embodiment.

The source node of the PMOS transistor MPH may be connected to a driving power supply VDD, and the source node of the NMOS transistor MN11 may be connected to ground VSS.

The source node of the PMOS transistor MP12 may be connected to the driving power supply VDD, and the drain node of the PMOS transistor MP12 may be connected to the drain node of the NMOS transistor MN11.

The gate node of the PMOS transistor MPH, the gate node of the NMOS transistor MN11, and the gate node of the PMOS transistor MP12 may be connected to the same input node and may be provided with (e.g., receive) the same input signal, such as an input signal A.

The drain node of the PMOS transistor MPH, the drain node of the NMOS transistor MN11, and the drain node of the PMOS transistor MP12 may be connected to the same output node, and may thus output an output signal Y.

Referring to FIG. 23, a second inverter may include an NMOS transistor MN12, an NMOS transistor MN13, and a PMOS transistor MP13 according to at least one example embodiment.

The source node of the NMOS transistor MN12 may be connected to ground VSS, and the source node of the NMOS transistor MN13 may also be connected to the ground VSS.

The gate node of the NMOS transistor MN12, the gate node of the NMOS transistor MN13, and the gate node of the PMOS transistor MP13 may be connected to the same input node and may be provided with (e.g., receive) the same input signal, such as an input signal A.

The drain node of the NMOS transistor MN12, the drain node of the NMOS transistor MN13, and the drain node of the PMOS transistor MP13 may be connected to the same output node, and may thus output an output signal Y.

Figure 24:
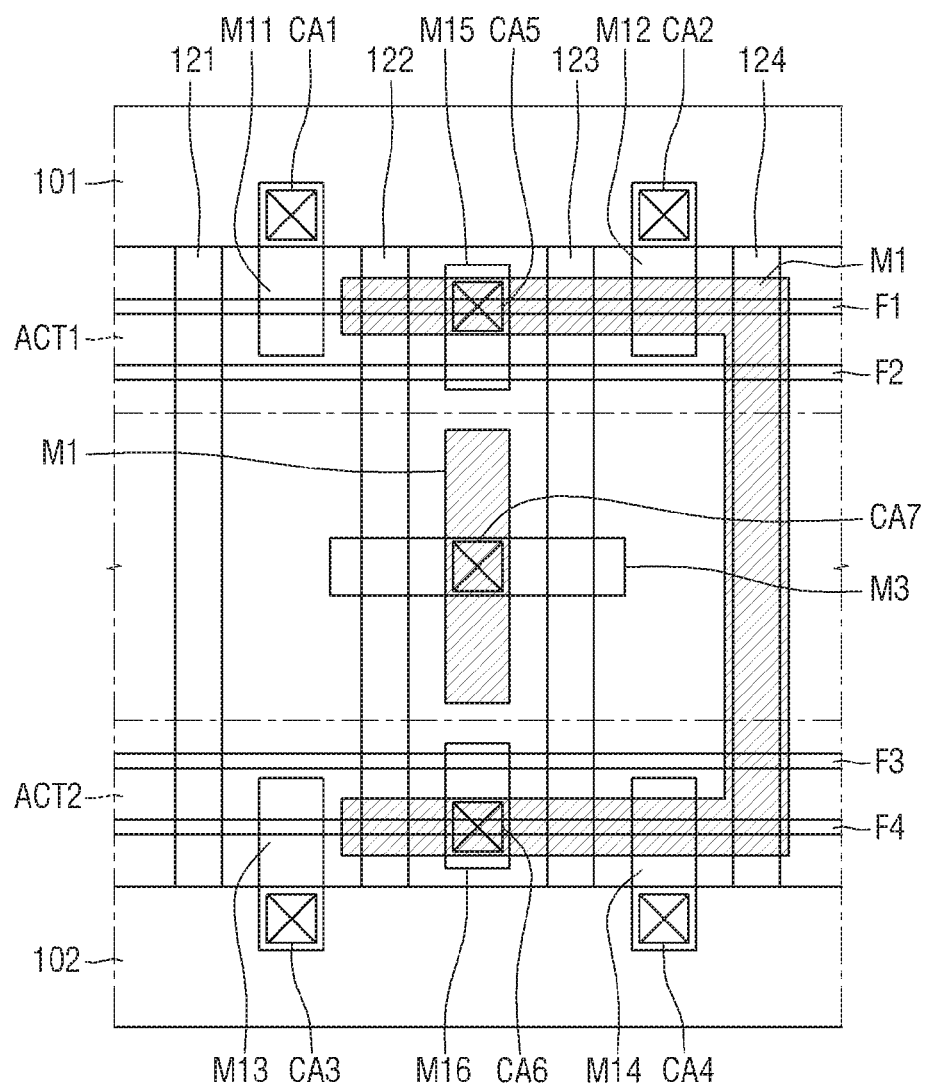
FIG. 24 is a layout view of a semiconductor device according to some example embodiments of the present disclosure.

FIG. 24 is a layout view of a semiconductor device according to some example embodiments of the present disclosure.

Referring to FIG. 24, the semiconductor device according to some example embodiments of the present disclosure may include a first power rail 101, a second power rail 102, a first active region ACT1, a second active region ACT2, first through fourth gate lines 121 through 124, first through fourth active fins F1 through F4, first through sixth metal structures M11 through M16, first through seventh contact structures CA1 through CA7, a first metal line M1, a second metal line M2, and a third metal line M3. However, the example embodiments are not limited thereto.

The semiconductor device illustrated in FIG. 24 may be a semiconductor device having a Fin Field Effect Transistor (FinFET) structure. The first through fourth active fins F1 through F4 may be formed in the first or second active region ACT1 or ACT2 to protrude (e.g., extend). The inventive concepts of the present disclosure are also applicable to the semiconductor device of FIG. 24 regardless of the FinFET structure of the semiconductor device of FIG. 24, because the second and third gate lines 122 and 123 have a two-finger structure.

The first power rail 101, the second power rail 102, the first active region ACT1, the second active region ACT2, the first through fourth gate lines 121 through 124, the first through sixth metal structures M11 through M16, the first through seventh contact structures CA1 through CA7, the first metal line M1, the second metal line M2, and the third metal line M3 are substantially the same as described above in connection to FIG. 4 and discussion thereof will be omitted here.

The structure to which various example embodiments of the present disclosure are applicable has been described above, but the inventive concepts are not limited thereto. Particularly, one or more of the inventive concepts of the present disclosure are also applicable to a structure comprising two or more fingers.

Figure 25:
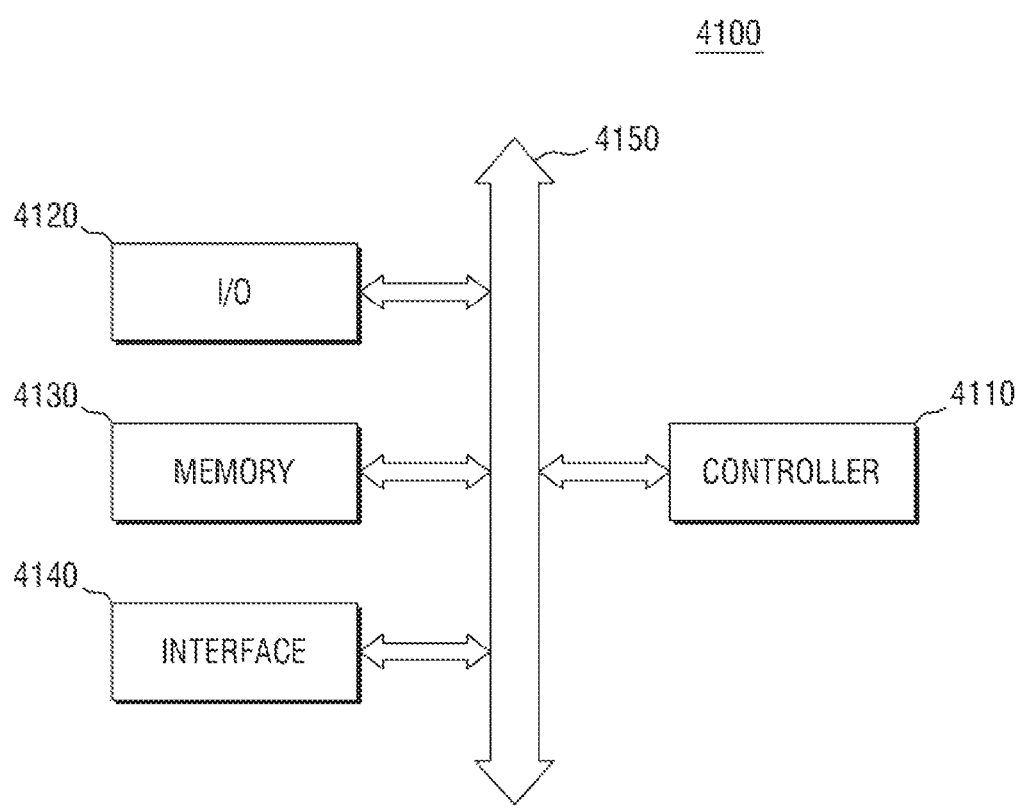
FIG. 25 is a block diagram of an electronic system including the semiconductor device according to some example embodiments of the present disclosure.

FIG. 25 is a block diagram of an electronic system including the semiconductor device according to some example embodiments of the present disclosure.

Referring to FIG. 25, an electronic system 4100 may include a controller 4110, an input/output (I/O) device 4120, a memory device 4130, an interface 4140, a bus 4150, etc., but is not limited thereto.

The controller 4110, the I/O device 4120, the memory device 4130, and/or the interface 4140 may be connected to one another via the bus 4150. The bus 4150 may be a path via which data is transmitted.

The controller 4110 may be at least one processing device, and may include for example at least one of a microprocessor, a digital signal processor, a microcontroller, a central processing unit (CPU), a field programmable gate array (FPGA), an application specific integrated circuit (ASIC), etc., and/or a logic element performing similar functions to a microprocessor, a digital signal processor, a microcontroller, a central processing unit (CPU), etc.

Examples of the I/O device 4120 may include a keypad, a keyboard, a display device, a touch panel, a microphone, a speaker, a camera, etc.

The memory device 4130 may store data and/or commands.

The interface 4140 may be a communication interface that can transmit data to, or receive data from, a communication network over a wired and/or wireless network. The interface 4140 may be a wired and/or wireless interface. Examples of the interface 4140 may include an antenna, a wired and/or wireless transceiver, etc.

Although not illustrated, the electronic system 4100 may also include an operating memory for improving the operation of the controller 4110, such as a high-speed dynamic random access memory (DRAM) and/or static random access memory (SRAM). The semiconductor device according to some example embodiments of the present disclosure may be provided in the memory device 4130 or may be provided as part of the controller 4110 or the I/O device 4120.

The electronic system 4100 of FIG. 25 may also be provided as, for example, a personal computer, an Ultra Mobile PC (UMPC), a work station, a net-book computer, a Personal Digital Assistant (PDA), a portable computer, a web tablet, a smart phone, a wireless phone, a mobile phone, an e-book, a portable multimedia player (PMP), a gaming console, a portable game console, a navigation device, a black box, a digital camera, a television set, a 3-dimensional television set, a digital audio recorder, a digital audio player, a digital picture recorder, a digital picture player, a digital video recorder, a digital video player, other smart devices, a wearable device, an Internet of Things (IoT) device, a virtual reality (VR) device, an augmented reality (AR) device, a device capable of transmitting and receiving data in a wired and/or wireless environment, one of a variety of electronic devices that constitute a home network, one of a variety of electronic devices that constitute a computer network, one of a variety of electronic devices that constitute a telematics network, a radio frequency identification (RFID) device, or one of a variety of electronic devices that constitute a computing system.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments.

While some example embodiments have been particularly shown and described, it will be understood by one of ordinary skill in the art that variations in form and detail may be made therein without departing from the spirit and scope of the claims.

As is traditional in the field of the inventive concepts, various example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar processing devices, they may be programmed using software (e.g., microcode) to perform various functions discussed herein and may optionally be driven by firmware and/or software, thereby transforming the microprocessor or similar processing devices into a special purpose processor. Additionally, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

What is claimed is:

1. A semiconductor device, comprising:
   a first active region;
   a second active region spaced apart from the first active region; a first gate line, a second gate line, and a third gate line, the first gate line, the second gate line, and the third gate lines disposed to overlap the first and the second active regions and spaced apart from each other, the first gate line including a first N-type Metal-Oxide-Semiconductor (NMOS) transistor and a first P-type Metal-Oxide-Semiconductor (PMOS) transistor, the second gate line including a second NMOS transistor and a second PMOS transistor, the third gate line including a third NMOS transistor and a third PMOS transistor;
   a first metal line configured to provide a first signal to both the first and the second gate lines as an input; and
   a second metal line configured to transmit a second signal in response to the first signal, and provide the second signal to the third gate line as an input, wherein parts of the first and the second active regions between the first and the third gate lines are formed without a break region that physically separates the first or the second active region.

2. The semiconductor device of claim 1, further comprising:
   a fourth gate line spaced apart from the first, the second, and the third gate lines and disposed to overlap the first active region.

3. The semiconductor device of claim 2, further comprising:

a fifth gate line spaced apart from the first, the second, the third, and the, fourth gate lines, and disposed to overlap the second active region.

4. The semiconductor device of claim 3, wherein:
the fourth gate line is configured to receive a third signal;
the fifth gate line is configured to receive a fourth signal; and
the second, the third, and the fourth signals are different signals.

5. The semiconductor device of claim 1, wherein:
the first and the second PMOS transistors are configured to share a first drain region; and
the first and the second NMOS transistors are configured to share a second drain region.

6. A semiconductor device, comprising:
a first gate line including a first NMOS transistor and a first PMOS transistor, the first NMOS transistor configured to share a first drain node with the first PMOS transistor;
second gate line including a second NMOS transistor and a second PMOS transistor, the second NMOS transistor configured to share a second drain node with the second PMOS transistor;
a first node connected to, and configured to provide a first signal to, a gate node of the first PMOS transistor, a gate node of the first NMOS transistor, a gate node of the second PMOS transistor, and a gate node of the second NMOS transistor via a first metal line;
a second node connected to both the first and second drain nodes and configured to output a second signal via a second metal line in response to the first signal;
a third PMOS transistor configured to receive the second signal from the second node via a third gate line as an input signal; and
a third NMOS transistor configured to receive the second signal from the second node via the third gate line as an input signal, wherein parts of a first active region and a second active region between the first and the third gate lines are formed without a break region, the second active region spaced apart from the first active region.

7. The semiconductor device of claim 6, wherein:
the first PMOS transistor includes a first source node that is connected to a driving power supply; and
the first NMOS transistor includes a second source node that is connected to ground.

8. The semiconductor device of claim 7, wherein:
the second PMOS transistor includes a third source node that is connected to the driving power supply; and
the second NMOS transistor includes a fourth source node that is connected to the ground.

9. The semiconductor device of claim 8, wherein:
the third PMOS transistor includes a fifth source node that is connected to the driving power supply; and
the third NMOS transistor includes a sixth source node that is connected to the ground.

10. The semiconductor device of claim 6, further comprising:
a fourth PMOS transistor configured to share a drain node with the third PMOS transistor.

11. The semiconductor device of claim 10, further comprising:
a fourth NMOS transistor configured to share a drain node with the third NMOS transistor.

12. The semiconductor device of claim 11, wherein:
the fourth PMOS transistor includes a seventh source node;
the fourth NMOS transistor includes an eighth source node; and
the seventh source node and the eighth source node are both connected to an output node.

13. The semiconductor device of claim 12, wherein:
the fourth PMOS transistor is configured to receive a third signal via a fourth gate line;
the fourth NMOS transistor is configured to receive a fourth signal via a fifth gate line; and
the output node is configured to output a fifth signal.

14. The semiconductor device of claim 13, wherein:
the first PMOS transistor, the first NMOS transistor, the second PMOS transistor, and the second NMOS transistor are configured to form a first latch circuit; and
the third PMOS transistor, the fourth PMOS transistor, the third NMOS transistor, and the fourth NMOS transistor are configured to form a second latch circuit.

15. The semiconductor device of claim 14, wherein:
the first latch circuit is a master latch circuit; and
the second latch circuit is a slave latch circuit.

* * * * *